United States Patent [19]

Yamazaki

[11] Patent Number: 5,142,344
[45] Date of Patent: * Aug. 25, 1992

[54] INSULATED GATE FIELD EFFECT TRANSISTOR AND ITS MANUFACTURING METHOD

[75] Inventor: Shunpei Yamazaki, Tokyo, Japan

[73] Assignee: Semiconductor Energy Laboratory Co., Ltd., Kanagawa, Japan

[ * ] Notice: The portion of the term of this patent subsequent to Sep. 25, 2007 has been disclaimed.

[21] Appl. No.: 707,178

[22] Filed: May 24, 1991

Related U.S. Application Data

[60] Continuation of Ser. No. 520,756, May 9, 1990, abandoned, which is a division of Ser. No. 153,477, Feb. 3, 1988, Pat. No. 4,959,700, which is a continuation of Ser. No. 735,697, May 20, 1985, abandoned.

[30] Foreign Application Priority Data

May 18, 1984 [JP] Japan ................................ 59-100250
May 18, 1984 [JP] Japan ................................ 59-100251
May 18, 1984 [JP] Japan ................................ 59-100252

[51] Int. Cl.⁵ .......................................... H01L 27/01
[52] U.S. Cl. .......................................... 357/23.7; 357/2; 357/4; 357/59; 357/60; 357/91; 357/23.4
[58] Field of Search ............... 357/23.4, 7, 2, 4, 59, 357/60, 91

[56] References Cited

U.S. PATENT DOCUMENTS 4,459,739 7/1984 Shepherd et al. ........ 148/DIG. 122
4,727,044 2/1988 Yamazaki ..................... 437/907
4,959,700 9/1990 Yamazaki ..................... 357/23.7

FOREIGN PATENT DOCUMENTS 135972 10/1981 Japan .................... 148/DIG. 91

OTHER PUBLICATIONS

G. Yaron & L. D. Hess, "Application of laser annealing techniques to increase channel mobility in silicon on sapphire transistors" Appl. Phys. Letts. 36(3), 1 Feb. 1980 pp. 220–222.

Primary Examiner—Edward J. Wojciechowicz
Attorney, Agent, or Firm—Sixbey, Friedman, Leedom & Ferguson

[57] ABSTRACT

An insulated gate field effect transistor comprises a non-single-crystalline semiconductor layer formed on a substrate, a gate electrode is formed on a portion of the surface of said semiconductor layer, and a gate insulated film is disposed between said gate electrode and said semiconductor layer. A non-single-crystalline channel region is defined within said semiconductor layer just below said gate electrode. A source region and a drain region are transformed from and defined within said semiconductor layer immediately adjacent to said channel region in an opposed relation, said source and drain regions being crystallized to a higher degree than that of said channel region by selectively irradiating portions of said semiconductor layer using said gate electrode as a mask.

6 Claims, 4 Drawing Sheets

INSULATED GATE FIELD EFFECT TRANSISTOR AND ITS MANUFACTURING METHOD

This application is a Continuation-In-Part of Ser. No. 07/520,756, filed May 9, 1990, now abandoned, which itself was a divisional application of Ser. No. 07/153,477, filed Feb. 3, 1988, now U.S. Pat. No. 4,959,700 which was a continuation of application Ser. No. 06/735,697, filed May 20, 1985, now abandoned.

BACKGROUND OF THE INVENTION

1. Field of the Invention

The present invention relates to an insulated gate field effect transistor (herein after refer to as an insulated gate FET or an FET) and its manufacturing method.

2. Description of the Prior Art

Heretofore there has been proposed an insulated gate FET of the type that it has a high resistivity semiconductor layer formed on a substrate having an insulating surface, a gate electrode formed on the semiconductor layer with a gate insulating layer sandwiched therebetween in a manner to divide the semiconductor into two as viewed from above, and N or P conductivity type source and drain regions formed in the semiconductor layer in a manner to leave a channel forming region between first and second regions on both sides of the gate electrode as viewed from above, the source and drain regions being lower in resistivity than the channel region.

The insulated gate FET of such a construction is called an N-channel type or P-channel type insulated gate FET depending upon whether the source and drain regions are the N or P conductivity type, and it operates in such a manner as follows:

When supplied with a control voltage across the source region and the gate electrode with a DC power source connected across the source and drain regions via a load, the insulated gate FET remains in the OFF state if the control voltage is lower than a certain threshold voltage when the FET is the N-channel type, or if the control voltage is higher than the threshold voltage when the FET is the P-channel type. In this case, substantially no current flow (drain current) is caused in the drain region, supplying no current to the load. In the case where the control voltage is higher than the threshold voltage when the FET is the N-channel type, or where the control voltage is lower than the threshold voltage when the FET is the P-channel type, however, a channel region of the same conductivity type as that of the source and drain regions is formed in the channel forming region to extend between the source and drain regions on the side of the gate insulating layer, and the FET is turned ON to cause the drain current to flow, feeding current to the load.

As a modification of the above insulated gate FET has been proposed such a structure that the entire region of the semiconductor layer is formed of a single-crystal semiconductor, and accordingly, the channel forming region, the first and second regions and the source and drain regions formed therein, respectively, are all formed of the single-crystal semiconductor.

With such an insulated gate FJT, however, the semiconductor layer cannot be formed on the substrate unless the substrate is made of an insulating or semi-insulating single-crystal semiconductor.

When the semiconductor layer is formed of the single-crystal semiconductor layer, especially when the channel forming region is formed of the single-crystal semiconductor, it has a smaller optical energy gap than does it when formed of a non-single-crystal semiconductor. For example, when the semiconductor layer is made of the single-crystal silicon, the optical energy gap of the channel forming region is 1.1 eV. On account of this, when the FET is in the OFF state, the drain current is small but larger than in the case where the channel forming region is formed of the non-single-crystal semiconductor.

For this reason, the abovesaid insulated gate FET is poorer in the OFF characteristic than in the case where the channel forming region is made of the non-single-crystal semiconductor.

Another modified form of the above insulated gate FET heretofore proposed has such a structure that the entire region of the semiconductor layer is formed of a non-single-crystal semiconductor doped with a recombination center neutralizer.

In the case of such an insulated gate FET, even if the substrate is not made of the insulating or semi-insulating single-crystal semiconductor, and even if the substrate is a metallic substrate which has an insulated surface, or such as a glass, ceramic, organic synthetic resin or like insulating material substrate, the semiconductor layer can be formed on the substrate. Further, since the channel forming region is made of the non-single-crystal semiconductor doped with a recombination center neutralizer, it has a larger optical energy gap than in the case where it is formed of the single-crystal semiconductor, so long as it is sufficiently doped with the recombination center neutralizer. For instance, when the semiconductor layer is formed of non-single-crystal silicon well doped with the recombination center neutralizer, the channel forming region has an optical energy gap in the range of 1.7 to 1.8 eV. In consequence, when the insulated gate FET is in the OFF state, the drain current will be markedly small, negligible as compared with that when the channel forming region is formed of the single-crystal semiconductor. Accordingly, so long as the semiconductor layer is sufficiently doped with the recombination center neutralizer, the FET will exhibit a more excellent OFF characteristic than does it when the channel forming region is made of the single-crystal semiconductor.

In the case of such an insulate gate FET having the semiconductor layer formed of the non-single-crystal semiconductor, impurity-doped regions are formed in the first and second regions, for example, by ion implantation of an N- or P-type impurity, and then the source and drain regions are formed by heat treatment for the activation of the impurity doped in the impurity-doped regions. During the heat treatment, however, the recombination center neutralizer doped in the channel forming region is diffused therefrom to the outside by the heat. Therefore, the channel forming region contains no required and sufficient amount of recombination center neutralizer, and hence has a smaller optical energy gap than the predetermined.

Accordingly, the conventional insulated gate FET with the semiconductor layer formed of the non-single-crystal semiconductor possesses an excellent OFF characteristic as compared with the case where the channel forming region is made of the single-crystal semiconductor, but the OFF characteristic is not fully satisfactory.

Moreover, in the case of the above prior art insulated gate FET of the type having the semiconductor layer formed of the non-single-crystal semiconductor, since the source and drain regions are also obtained by heat treatment, the recombination center neutralizer doped therein is diffused to the outside during the heat treatment. Thus, since the source and drain regions have the same optical energy gap as that of the channel forming region, there is set up between each of the source and drain regions and the channel forming region substantially no or very small potential barrier against carriers flowing from the source or drain regions toward the channel forming region.

This is another cause of the unsatisfactory OFF characteristic of the conventional insulated gate FET which has the semiconductor layer formed of the non-single-crystal semiconductor.

Besides, when the semiconductor layer, and accordingly the source and drain regions are formed of the non-single-crystal semiconductor, they has the same degree of crystallization as that of the channel forming region and a far higher resistance than in the case where they are made of the single-crystal semiconductor. On account of this, in the conventional insulated gate FET of the type having the semiconductor layer formed of the non-single-crystal semiconductor, the speed of switching between the ON and the OFF state is lower than in the case where the source and drain regions are formed of the single-crystal semiconductor. Accordingly, this FET has the defect that its ON-OFF operation cannot be achieved at high speed.

SUMMARY OF THE INVENTION

It is therefore an object of the present invention to provide a novel insulated gate FET which is free from the abovesaid defects of the prior art.

Another object of the present invention is to provide a novel method for the manufacture of such a novel insulated gate FET.

The insulated gate FET of the present invention has also the same structure as the above-described conventional insulated gate FET. That is, it has a high resistivity semiconductor layer formed on a substrate having an insulating surface, a gate electrode formed on the semiconductor layer with a gate insulating layer sandwiched therebetween so that it separates the semiconductor layer into two as viewed from above, and N or P conductivity type source and drain regions formed in the semiconductor layer so that they define a channel forming region between first and second regions on both sides of the gate electrode as viewed from above and extend vertically from the upper surface of the first and second regions toward the substrate, the source and drain regions having a lower resistivity than that of the channel forming region.

In the insulated gate FET of the present invention, however, the semiconductor layer is formed of a non-single-crystal semiconductor doped with a required and sufficient amount of recombination center neutralizer, and accordingly, the channel forming region is also formed of such a non-single-crystal semiconductor. In the first and second regions which constitute the source and drain regions in the semiconductor layer, there are provided on the sides of the source and drain regions, respectively, crystallized regions which have a higher degree of crystallization than the channel forming region and are doped with the recombination center neutralizer.

The insulated gate FET of the present invention is identical in construction with the aforesaid conventional insulated gage FET which has the semiconductor layer formed of the non-single-crystal semiconductor, except the inclusion of the abovesaid crystallized regions in the semiconductor layer.

Accordingly, the insulated gate FET of the present invention also operates in the same manner as the aforementioned conventional FET. That is, when supplied with a control voltage across the source region and the gate electrode with the power source connected across the source and drain regions via a load, it remains in the OFF state and causes no current flow to the load if the control voltage is lower (or higher) than a certain threshold voltage, and if the control voltage is higher (or lower) than the threshold voltage, it is turned ON to cause drain current to flow, supplying current to the load.

The insulated gate FET of the present invention has also the semiconductor layer formed of the non-single-crystal semiconductor, and hence it is free from the requirement that the substrate be an insulating or semi-insulating single-crystal semiconductor, as is the case with the conventional FET of this kind.

Further, since the semiconductor layer, and consequently the channel forming region is constituted of the non-single-crystal semiconductor doped with the recombination center neutralizer, the insulated gate FET of the present invention exhibits an excellent OFF characteristic over the FET in which the channel forming region is made of the single-crystal semiconductor.

In the insulated gate FET of the present invention, however, the channel forming region is doped with a required and sufficient amount of recombination center neutralizer, as will be evident from the manufacturing method of the present invention described later. Accordingly, the channel forming region has a predetermined optical energy gap, ensuring to provide an excellent OFF characteristic as compared with that of the conventional FET which has the semiconductor layer formed of the non-single-crystal semiconductor.

Moreover, in the insulated gate FET of the present invention, the crystallized regions, which have a higher degree of crystallization than the channel forming region and are doped with the recombination center neutralizer, are formed in the first and second regions which constitute the source and drain regions, respectively, and the crystallized regions form the effective regions of the source and drain regions. On the other hand, the crystallized regions have a smaller optical energy gap than does the channel forming region. Accordingly, there is established between each of the source and drain regions and the channel forming region a potential barrier against carriers which flow from the source or drain region toward the channel forming region.

This ensures that the FET of the present invention exhibits an excellent OFF characteristic over the conventional FET which has the semiconductor layer formed of the non-single-crystal semiconductor.

Besides, in the insulated gate FET of the present invention, the crystallized regions, which constitute the effective regions of the source and drain regions, are formed in the first and second regions, as mentioned above, and the crystallized regions are far lower in resistance than in the case where the first and second regions are not crystallized. On account of this, the speed at which the FET of the present invention is switched between the ON and OFF state is higher than in the case of the prior art FET which has the semiconductor layer formed of the non-single-crystal semiconductor. In other word, the ON-OFF operation of the FET of the present invention is higher in speed than the ON-OFF operation of the conventional FET.

The insulated gate FET manufacturing method of the present invention includes the following steps.

The manufacture starts with the formation of a non-single-crystal semiconductor layer doped with the recombination center neutralizer on a substrate having an insulating surface.

Next, a gate electrode is formed on the non-single-crystal semiconductor layer with a gate insulating layer sandwiched therebetween in such a manner that the non-single-crystal semiconductor layer is separated into two as viewed from above.

Next, source and drain regions doped with N- or P-type impurity and the recombination center neutralizer are formed in first and second regions of the non-single crystal semiconductor layer on both sides of the gate electrode, as viewed from above, in such a manner to leave therebetween a channel forming region doped with the recombination center neutralizer.

Next, the first and second regions of the non-single-crystal semiconductor layer are exposed to irradiation by light for annealing at a temperature at which the recombination center neutralizer doped in the non-single-crystal semiconductor layer does not substantially diffuse to the outside. By this, the first and second regions of the non-single-crystal semiconductor layer are crystallized to form crystallized regions on the sides of the source and drain regions. And the N-type or P-type impurity in the source and drain regions is activated. The crystallized regions have a higher degree of crystallization than the channel forming region, are doped with the recombination center neutralizer and extend vertically from the upper surface of the first and second regions toward the substrate. In this instance, it is preferable that the gate insulating layer be formed on the semiconductor layer to cover the entire area of the surface of each of first and second regions before the exposure to the light irradiation for annealing so as to prevent that the recombination center neutralizer diffuse to the outside from the source and drain regions and the crystallized regions. Further, it is preferable that the light irradiation for annealing be performed intermittently so as to prevent that the high-temperature heating of the crystallized regions by the light irradiation will cause unnecessary diffusion from the source and drain regions and the crystallized regions of the recombination center neutralizer to the outside.

With such a manufacturing method of the present invention, it is possible to easily fabricate the insulated gate FET of the present invention which possesses the aforesaid advantages.

Other objects, features and advantages of the present invention will become more fully apparent from the following detailed description taken in conjunction with the accompanying drawings.

DESCRIPTION OF THE PREFERRED EMBODIMENTS

FIGS. 1, 2, 3 and 4 illustrate first, second, third and fourth embodiments of the present invention, respectively, in which an island-shaped $N^-$-, $P^-$- or I-type non-single-crystal semiconductor layer 2 is formed, for example, 0.7 μm on, for example, a 1.1 mm thick insulating substrate 1 as of quartz glass. The non-single crystal semiconductor layer 2 is constituted of, for instance, amorphous, microcrystalline or polycrystalline silicon. The non-single-crystal semiconductor layer 2 is doped with a hydrogen or a halogen such as fluorine, as a recombination center neutralizer in an amount of 1 atom% or more. The non-single-crystal semiconductor layer 2 is deposited over the entire area of its surface with, for example, 1000Å thick gate insulating film 3 as of silicon nitride. A stripe-shaped gate electrode 5G, which is formed of, for example, microcrystalline or polycrystalline silicon heavily doped with an N-type impurity such as phosphorus or arsenic, is formed, for instance, 0.3 μm thick on the gate insulating film 3 in such a manner that the gate insulating film 5G separates the non-single-crystal semiconductor layer 2 into two, as viewed from above. In the non-single-crystal semiconductor layer 2 source and drain regions 5S and 5D, which are doped with an N-type impurity such as phosphorus or arsenic, are formed in regions on both sides of the gate electrode 5G in such a manner to define therebetween a channel region 5C.

Figure 1:
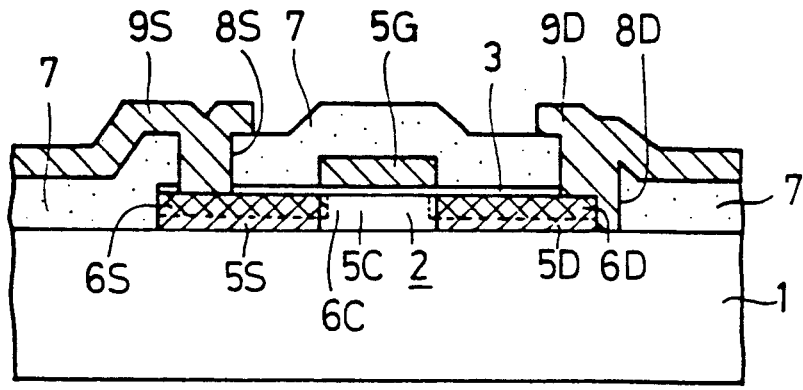
FIGS. 1, 2, 3A and 4 are sectional views schematically illustrating embodiments of the insulated gate FET of the present invention.
Figure 2:
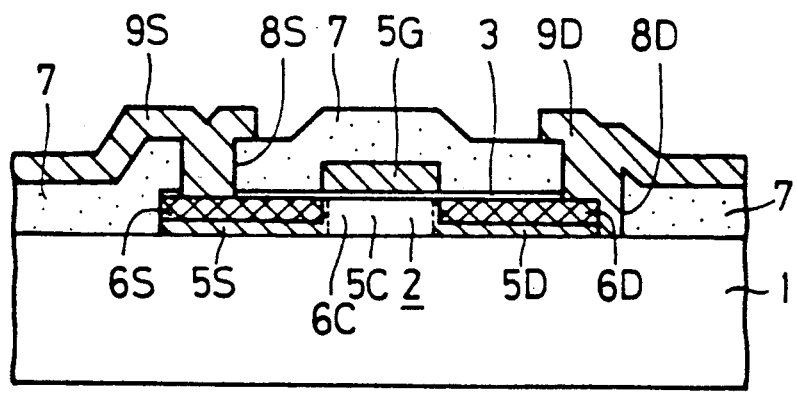
Figure 3:
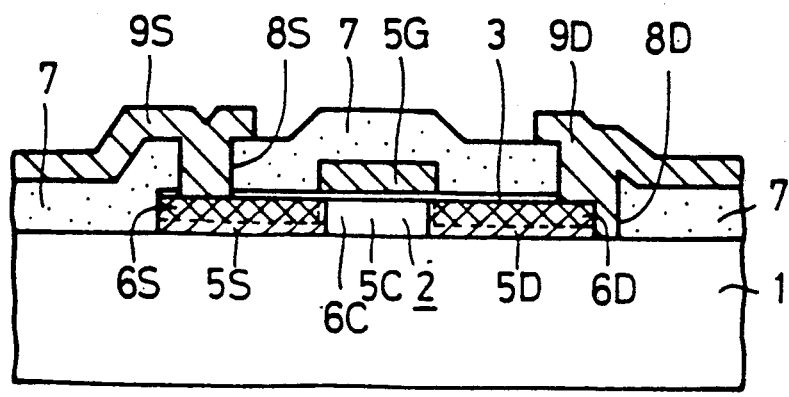
Figure 4:
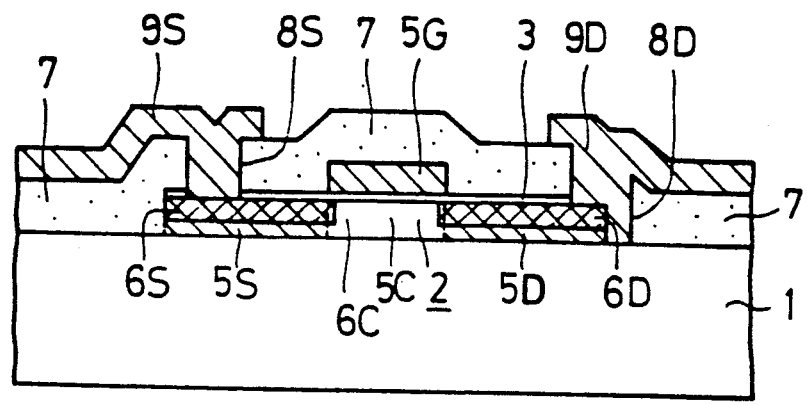

In this instance, the marginal edges of the source and drain regions 5S and 5D on the side of the channel region 5C laterally extend to positions right under the opposite marginal edges of the gate electrode 5G, as shown in FIGS. 1 and 2, or to the vicinities of the abovesaid positions, as shown in FIGS. 3 and 4. Further, the source and drain regions 5S and 5D vertically extend past the non-single-crystal semiconductor layer 2 down to the insulating substrate 1, as shown in FIGS. 1 and 3. Alternatively, the source and drain regions 5S and 5D vertically extend past the non-single-crystal semiconductor layer 2 but not down to the substrate 1, as shown in FIGS. 2 and 4.

The two regions of the non-single-crystal semiconductor layer 2 on both sides of the gate electrode 5G, as viewed from above, have formed therein crystallized regions 6S and 6D which define therebetween a non crystallized region 6C.

In this case, when the semiconductor layer 2 is constituted of an amorphous semiconductor, the crystallized regions 6S and 6D are formed of a microcrystalline or polycrystalline semiconductor, or a mixture thereof, a mixture of the microcrystalline and/or polycrystalline semiconductor and the amorphous semiconductor, or a single-crystal semiconductor. When the semiconductor layer 2 is constituted of the microcrystalline or polycrystalline semiconductor, the regions 6S and 6D are formed of the microcrystalline, polycrystalline or single-crystal semiconductor which has a higher degree of crystallization than does the starting microcrystalline or polycrystalline semiconductor.

The crystallized regions 6S and 6D vertically extend past the semiconductor layer 2 down to the insulating substrate 1, for example, as shown in FIGS. 2 and 4. Alternatively, the regions 6S and 6D vertically extend past the semiconductor layer 2 but not down to the insulating substrate 1, as depicted in FIGS. 1 and 3. The marginal edges of the regions 6S and 6D on the side of the non-single-crystallized region 6C laterally extend across the source and drain regions 5S and 5D under the gate electrode 5G, as shown in FIGS. 1 and 2. Alternatively, the abovesaid marginal edges of the regions 6S and 6D laterally extend but not across the source and drain regions 5S and 5D, as illustrated in FIGS. 3 and 4. The insulating substrate 1 has formed thereon an insulating film 7 which covers the semiconductor layer 2, the gate insulating film 3 and the gate electrode 5G.

The insulating film 7 is covered with interconnection layers 9S and 9D which make ohmic contact with the source and drain regions 6S and 6D through holes 8S and 8D made in the insulating film 7. Further, on the insulating film 7 is formed an interconnection layer 8G (not shown) which make ohmic contact with the gate electrode 5G.

With such an insulated gate FIT of the present invention as described above, when it is supplied with a control (gate) voltage across the source and gate regions 5S and 5G via the interconnection layers 8S and 8G in a state in which a DC Power source (not shown) in connected across the source and drain regions 5S and 5G via a load (not shown), if the control voltage is higher than a certain threshold voltage which is negative relative to the side of the gate electrode 5G, or zero or positive, then an N-type channel which extends between the source and drain regions 5S and 5D is formed in the channel region 6C on the side of the gate insulating film 3 and a drain current is caused to flow across the drain region 5D, supplying current to the load. The insulated gate FET in which the drain current flows when the gate voltage is higher than a certain negative threshold voltage is commonly referred to as a depletion type, and in this case, the drain current flows even if the gate voltage is zero. The insulated gate FET which causes the drain current flow when the gate voltage is higher than a certain positive threshold voltage is commonly referred to as an enhancement type.

When the gate voltage is lower than the abovesaid gate voltage, the FET remains in the OFF state and causes substantially no drain current to flow.

The channel forming region 5C or noncrystallized region 6C is doped with the recombination center neutralizer in a required and sufficient amount, and the source and drain regions 5S and 5D and the crystallized regions 6S and 6D are also doped with the recombination center neutralizer.

The crystallized regions 6S and 6D constitute the effective regions of the source and drain regions 5S and 5D. The regions 6S and 6D are lower in resistance than the non-crystallized region 6C. Accordingly, such an excellent OFF characteristic as referred to previously in the "Summary" can be obtained, though not described in detail, and this permits a high-speed ON-OFF operation.

Figure 5A:
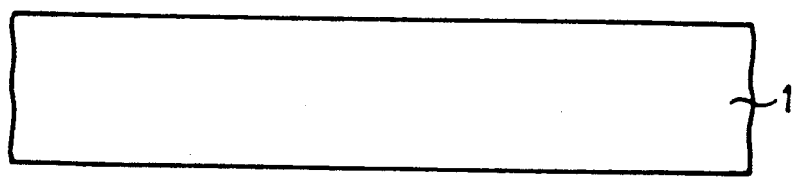
FIGS. 5A to 5G are sectional views schematically illustrating a sequence of steps involved in the manufacture of the insulated gate FET of FIG. 1 according to the manufacturing method of the present invention.

FIGS. 5A though 5G illustrate the manufacturing method of the insulated gate FET of the present invention described previously in conjunction with FIG. 1. In FIG. 5, the like parts corresponding to those in FIG. 1 are identified by the same reference numerals and no detailed description thereof will be repeated.

The manufacture starts with the preparation of the same substrate 1 as mentioned previously with respect to FIG. 1 (FIG. 5A).

Figure 5B:
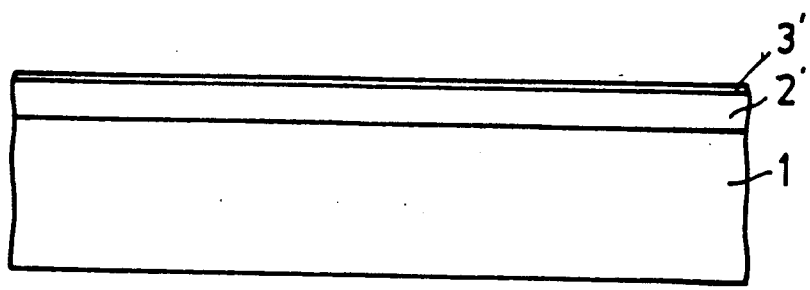

In the next step, a non-single-crystal semiconductor layer 2' which contain the recombination center neutralizer in an amount of 1 atom% or more and which will ultimately form the non-single-crystal semiconductor layer 2 and an insulating layer 3' which will ultimately form the gate insulating layer 3, are formed in that order over the entire area of the surface of the substrate 1 by means of, for example, a light plasma CVD process holding the substrate 1 at 250° C., for instance (FIG. 5B). In the formation of the semiconductor layer 2', care should be taken so that oxygen, nitrogen or carbon, which will shorten the carrier lifetime in the ultimate layer 2, is not contained therein in a large amount exceeding $5 \times 10_{18}$ atom/cm$^3$ in order to obtain a large drain current during the ON state of the ultimate FET and to prevent the introduction of a hysterisis characteristic in the gate voltage-drain current characteristic of the FET.

Figure 5C:
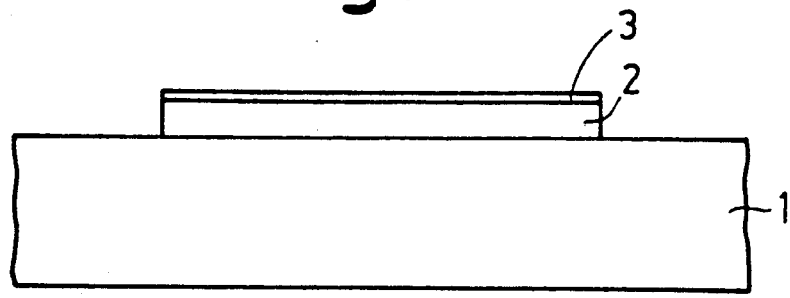

Next, the laminate member composed of the non-single-crystal semiconductor layer 2' and the insulating layer 3' is subjected to an etching process which employs a plasma obtainable at room temperature by exciting, for example, a gas mixture of CF$_4$ and oxygen at a high frequency of, for instance, 13.56 MHz. By this, the non-single-crystal semiconductor layer 2 and the insulating layer 3, described previously with respect to FIG. 1 are formed (FIG. 5C).

Figure 5D:
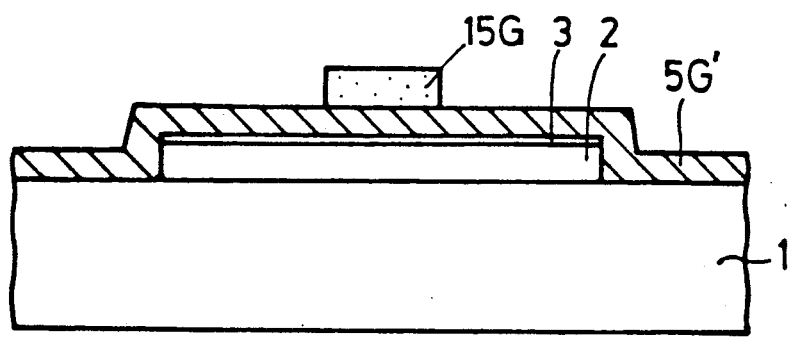

Next, a conductive layer 5G', which will ultimately form the gate electrode 5G mentioned previously with respect to FIG. 1, is formed on the substrate 1 to cover the semiconductor layer 2 and the insulating layer 3. Then a mask layer 15G as of photo resist is formed in a pattern of the gate electrode 5G on the conductive layer 5G' (FIG. 5D).

Figure 5E:
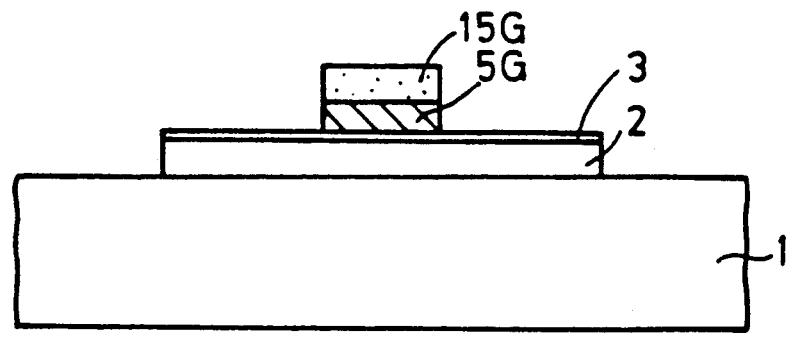

After this, the conductive layer 5G' is selectively etched away through the mask layer 15G, forming the abovesaid gate electrode 5G (FIG. 5E).

Figure 5F:
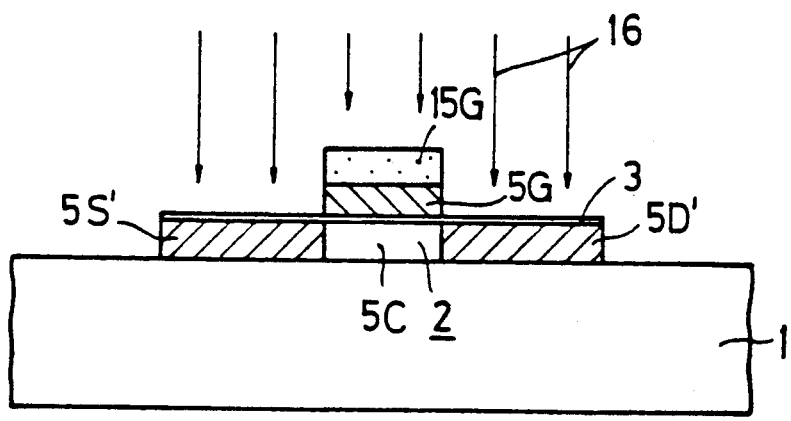

This is followed by the implantation of an N-type impurity ion, for example, a phosphorus ion, into the non-single-crystal semiconductor layer 2 using the laminate member composed of the gate electrode 5G and the mask layer 15G. By this, regions 5S' and 5D', which will form the activated source and drain regions 5S and 5D by the next step, are formed to leave therebetween the channel forming region 5C described previously in connection with FIG. 1 (FIG. 5F). In this case, the substrate 1 is held below 400° C. so that the recombination center neutralizer doped in the semiconductor layer 2 are not diffused to the outside thereof.

Figure 5G:
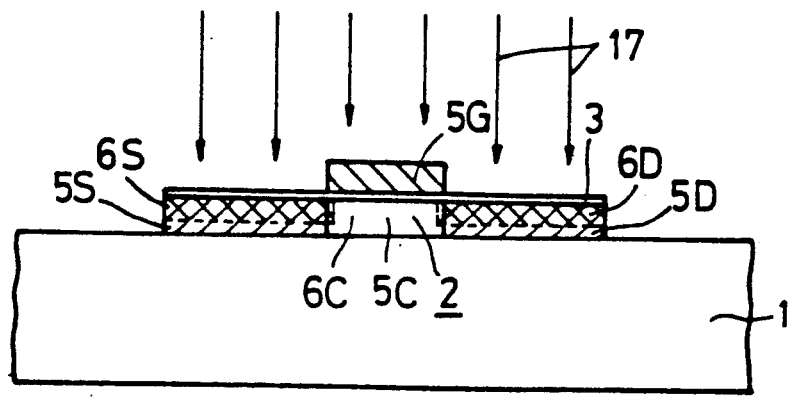

Next, the mask layer 15G is removed from the gate electrode 5G, after which the regions 5S' and 5D' are scanned all over them, together with the gate electrode 5G, for example, at a rate of 5 to 50 cm/minute, by light 17 for annealing which is obtainable with, for instance, an ultra-high mercury lamp and which has a wavelength of 250 to 600 nm, a beam diameter of 15 mm and an output of 5 KW. By this, the crystallized regions 6S and 6D mentioned previously in conjunction with FIG. 1 are formed, and at the same time, the regions 5S' and 5D' are activated, providing the ultimate source and drain regions 5S and 5D (FIG. 5G). The crystallized regions 6S and 6D thus obtained have a sheet resistance as low as $1 \times 10^2$ $(\Omega cm)^{-1}$ when the sheet resistance of the channel forming region is $4 \times 10^{-3}$ $(\Omega cm)^{-1}$. In this case, the substrate 1 is held below 400° C. so that the recombination center neutralizer doped in the semiconductor layer 2 are not diffused to the outside thereof. Further, the light irradiation may also be effected intermittently with a view to prevent the semiconductor layer 2 from being heated to such a high temperature that causes the diffusion of the recombination renter neutralizer to the outside of the layer 2. In this instance, when the gate electrode 5G is a phosphorus-doped non-single-crystal semiconductor layer, its degree of crystallization is higher than that before exposure to the light irradiation.

Next, the substrate 1 is coated with the insulating film 7 as depicted in FIG. 1, and then the contact holes 8S, 8D and 8G (the hole 8G being not shown) are made in the insulating film 7. After this, the interconnection layers 9S, 9D and 9G are formed on the insulating film 7 so that they make ohmic contact with the source and drain regions 5S and 5D and the gate electrode 5G through the contact holes 8S, 8D and 8G, respectively.

In the manner described above, the insulated gate FET mentioned in connection with FIG. 1 is fabricated.

With the insulated gate FET thus obtained, according to my experiments, the drain current obtained during the ON state was as large as $1\times10^{-5}$ to $2\times10^{-5}$ (A), whereas during the OFF state it was as small as $10^{-10}$ to $10^{-11}$ (A) Further, since the crystallized regions 6S and 6D laterally extend across the source and drain regions 5S and 5D to underlie the gate electrode 5G, a high avalanche breakdown voltage can be obtained.

While the foregoing description has been given of the manufacture of the insulated gate FET of the present invention depicted in FIG. 1, it will be seen that the insulated gate FETs of the present invention shown in FIGS. 2, 3 and 4 can also be fabricated by method of the present invention similar to that described above.

It will be apparent that many modifications and variations may be effected without departing from the scope of the novel concepts of the present invention.

What is claimed is:

1. An insulated gate field effect transistor comprising:
   a semiconductor layer provided on an insulating surface of a substrate;
   source and drain regions provided in said semiconductor layer;
   a channel region defined between said source and drain regions in said semiconductor layer;
   crystallized regions which are provided in said semiconductor layer and extend from said source and drain regions to said channel region respectively,
   wherein the crystallized regions define therebetween a low-crystallization region having a lower degree of crystallization than that of said crystallized regions, said low-crystallization region located in said channel region.

2. The insulated gate field effect transistor of claim 1 wherein said crystallized regions extend down to said insulating surface.

3. The insulated gate field effect transistor of claim 1 wherein said crystallized regions extend vertically and do not extend down to said insulating surface.

4. An insulated gate field effect transistor comprising:
   a semiconductor layer provided on an insulating surface of a substrate;
   source and drain regions provided in said semiconductor layer;
   a channel region defined between said source and drain regions in said semiconductor layer;
   crystallized regions which are provided in said semiconductor layer and extend from said source and drain regions toward said channel region respectively,
   wherein the crystallized regions define therebetween a low-crystallization region having a lower degree of crystallization than that of said crystallized regions, said low-crystallization region located at least in part in said source and drain regions, respectively.

5. The insulated gate field effect transistor of claim 4 wherein said crystallized regions extend down to said insulating surface.

6. The insulated gate field effect transistor of claim 4 wherein said crystallized regions extend vertically and do not extend down to said insulating surface.

* * * * *